United States Patent
Cheung

(10) Patent No.: US 6,766,492 B2
(45) Date of Patent: Jul. 20, 2004

(54) FINITE STATE AUTOMATON FOR CONTROL OF FRAME ERROR RECOVERY FOR A UNIVERSAL SERIAL BUS VIDEO CAMERA

(75) Inventor: Chi Cheung, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 460 days.

(21) Appl. No.: 09/990,748

(22) Filed: Nov. 16, 2001

(65) Prior Publication Data

US 2003/0097631 A1 May 22, 2003

(51) Int. Cl.⁷ .......................... H03M 13/00; H04N 7/64; H04N 7/36
(52) U.S. Cl. ......................... 714/776; 714/18; 714/48; 375/240.27; 382/236; 382/239
(58) Field of Search ........................... 714/776, 18, 48; 375/240.01, 240.02, 240.03, 240.14, 240.13, 240.15, 240.12, 240.26, 240.27; 382/236, 239

(56) References Cited

U.S. PATENT DOCUMENTS

| | | | | |
|---|---|---|---|---|
| 5,757,670 A | * | 5/1998 | Ti et al. ................. | 375/240.01 |
| 5,793,895 A | * | 8/1998 | Chang et al. ............... | 382/236 |
| 6,259,736 B1 | * | 7/2001 | Chujoh et al. ......... | 375/240.13 |
| 6,289,054 B1 | * | 9/2001 | Rhee ..................... | 375/240.27 |
| 6,421,387 B1 | * | 7/2002 | Rhee ..................... | 375/240.27 |

* cited by examiner

*Primary Examiner*—Emmanuel L. Moise
(74) *Attorney, Agent, or Firm*—Marger Johnson & McCollom, PC

(57) ABSTRACT

A video apparatus and method are described for controlling video frame error recovery in a streaming video session. Frame error recovery is activated and deactivated by a frame error recovery automaton. Frame error recovery is activated by a first frame error in the video data stream. The automaton monitors the video session, maintaining recovery if a further error is detected. The automaton monitors the data stream for a predetermined frame error probation period.

18 Claims, 5 Drawing Sheets

FINITE STATE AUTOMATON FOR CONTROL OF FRAME ERROR RECOVERY FOR A UNIVERSAL SERIAL BUS VIDEO CAMERA

BACKGROUND OF THE INVENTION

The present disclosure is related to the field of streaming video, and more specifically to a multi-state automaton for controlling deployment of frame error recovery for a universal serial bus video camera.

Occurrence of frame errors while streaming video from a universal serial bus (USB) video camera is unpredictable. One factor affecting frame error is the quality of the camera, including the compression circuitry in the application-specific integrated circuit (ASIC). Another factor is the quality of the USB controller and its driver. In addition, the real-time performance of the operating system affects data packet size and handling.

Further, frame error recovery is generally undertaken by the driver. A typical scheme comprises backing up the last frames and resending them as needed. However, this strategy entails backing up substantial amounts of data.

The present invention addresses this and other problems associated with the prior art. The invention will become more readily apparent from the following Detailed Description, which proceeds with reference to the drawings.

DETAILED DESCRIPTION OF EMBODIMENTS

The present disclosure provides a multi-state automaton for controlling frame error recovery for a video camera.

Figure 1:
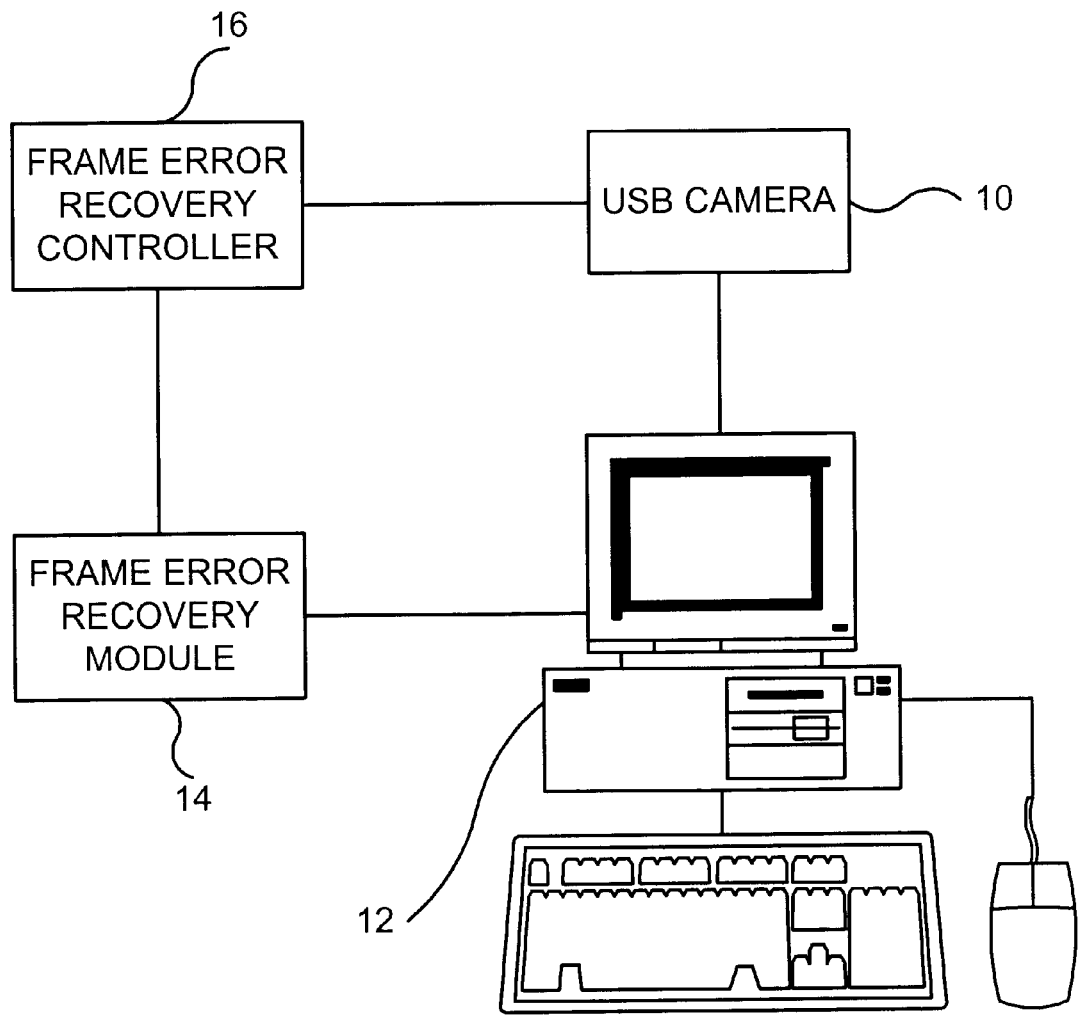
FIG. 1 is a diagram of a video apparatus according to the present disclosure.

As shown in FIG. 1, a representative video apparatus according to the present disclosure comprises a video device 10, a computer 12, a frame error recovery module 14, and a frame error recovery automaton 16.

The video device 10 is adapted to capture video frame data and output same. An exemplary device is a USB video camera. Such cameras are well-known in the art.

The video device 10 is coupled to the computer 12. The computer includes a processor capable of executing instructions stored on storage medium. In the embodiment of the apparatus shown in FIG. 1, the frame error detection can be performed by the computer or alternatively by another apparatus component, e.g., the automaton 16 or USB video camera 10.

The apparatus includes a frame error recovery module 14 comprising frame error correction technology. Frame error recovery technology is conventionally in the form of software. Such correction technology for streaming video are well-known in the art. The present disclosure refers interchangeably to the frame error recovery technology and the frame error recovery module.

The frame error recovery module 14 is operative in multiple states, which are discussed more fully below. The frame error recovery automaton 16 is adapted to control the frame error recovery module, i.e., to control state switching.

Figure 2:
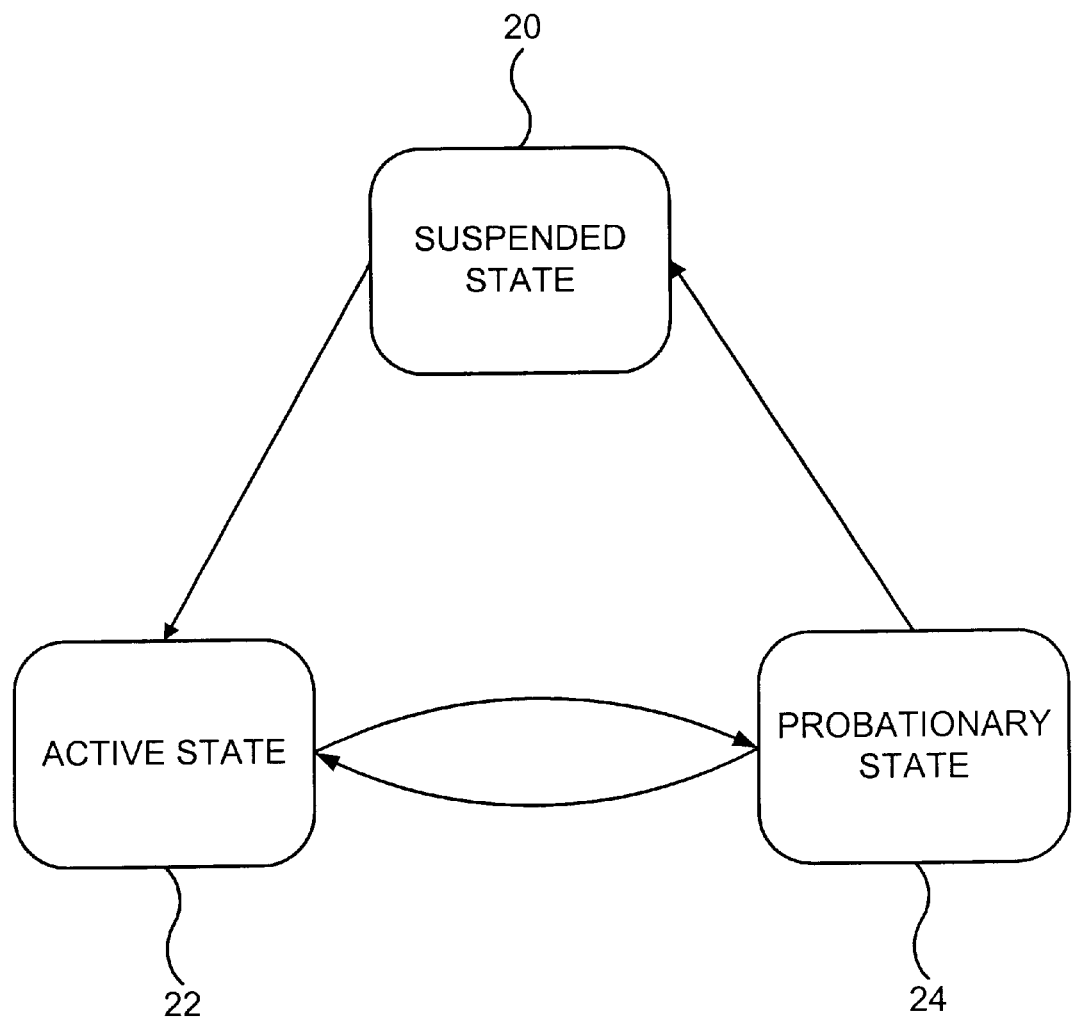
FIG. 2 is a diagram of finite frame error recovery states.

FIG. 2 shows states in which the present FER automaton 16 is adapted operate. The states comprise suspended, active and probationary.

In suspended state 20, frame error recovery is inactive; i.e., a streaming video apparatus is operating with error correction technology disabled.

Active state 22 operation comprises enabled frame error correction.

Probationary state 24 comprises maintaining the active state for a predetermined time. Various events or occurrences can be monitored during the probationary time.

Figure 3:
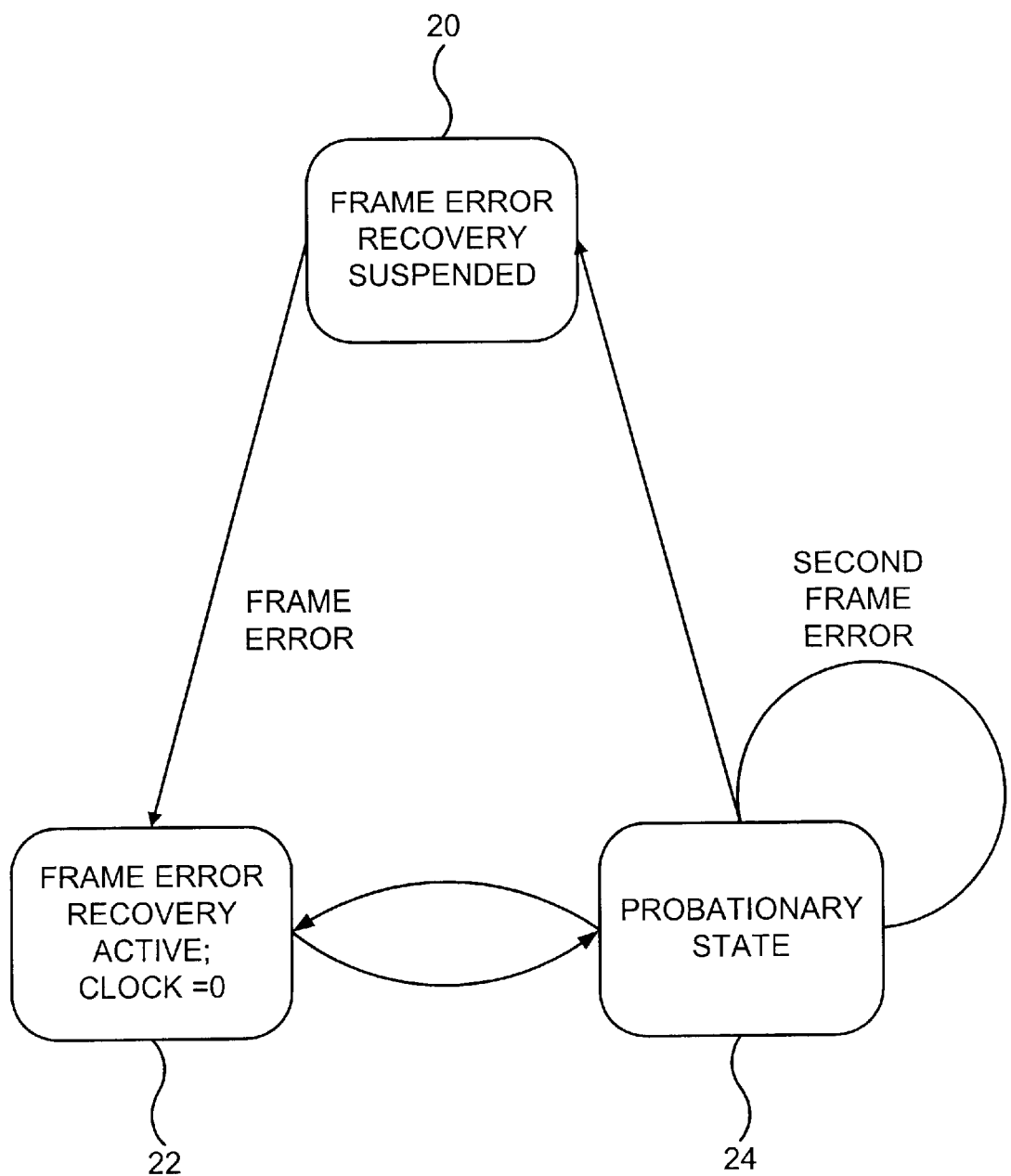
FIG. 3 is a more detailed diagram of the finite frame error recovery states, showing the interrelationships thereof.

The interrelationships between these states, and events triggering switches from state to state, are shown in greater detail in FIG. 3. The automaton 16 is operative to switch states in response to a plurality of events.

The apparatus is placed in suspended state 20 when the USB video camera 10 is initially powered up. When a first video session is initiated, the frame error recovery module is inactive, conserving power and maximizing operating speed.

Detection of a frame error in the streaming video data may trigger a switch to active state 22. As mentioned, such detection can be performed by any component of the apparatus.

In probationary state 24, the automaton 16 is adapted to monitor for certain occurrences. In the embodiment of FIG. 3, for example, the automaton monitors for a second frame error during the video session. If a second frame error is detected, frame error recovery remains active and the probationary period is restarted. If the probationary period expires without a second frame error having been detected, the frame error recovery is deactivated and the apparatus is switched back to suspended state 20.

Detection of a frame error can be in the form of direct detection by the automaton or by way of a frame error signal transmitted to the automaton by the apparatus component detecting the frame error.

Initiating a second video session during the probationary period does not perturb the probationary state 24. Thus, termination of the video session in which the first frame error was detected does not truncate the probationary period, which continues for a predetermined period of aggregate but not necessarily continuous video camera use. Alternatively, of course, the probationary period can be restarted when the first video session is terminated and a second session initiated.

Figure 4:
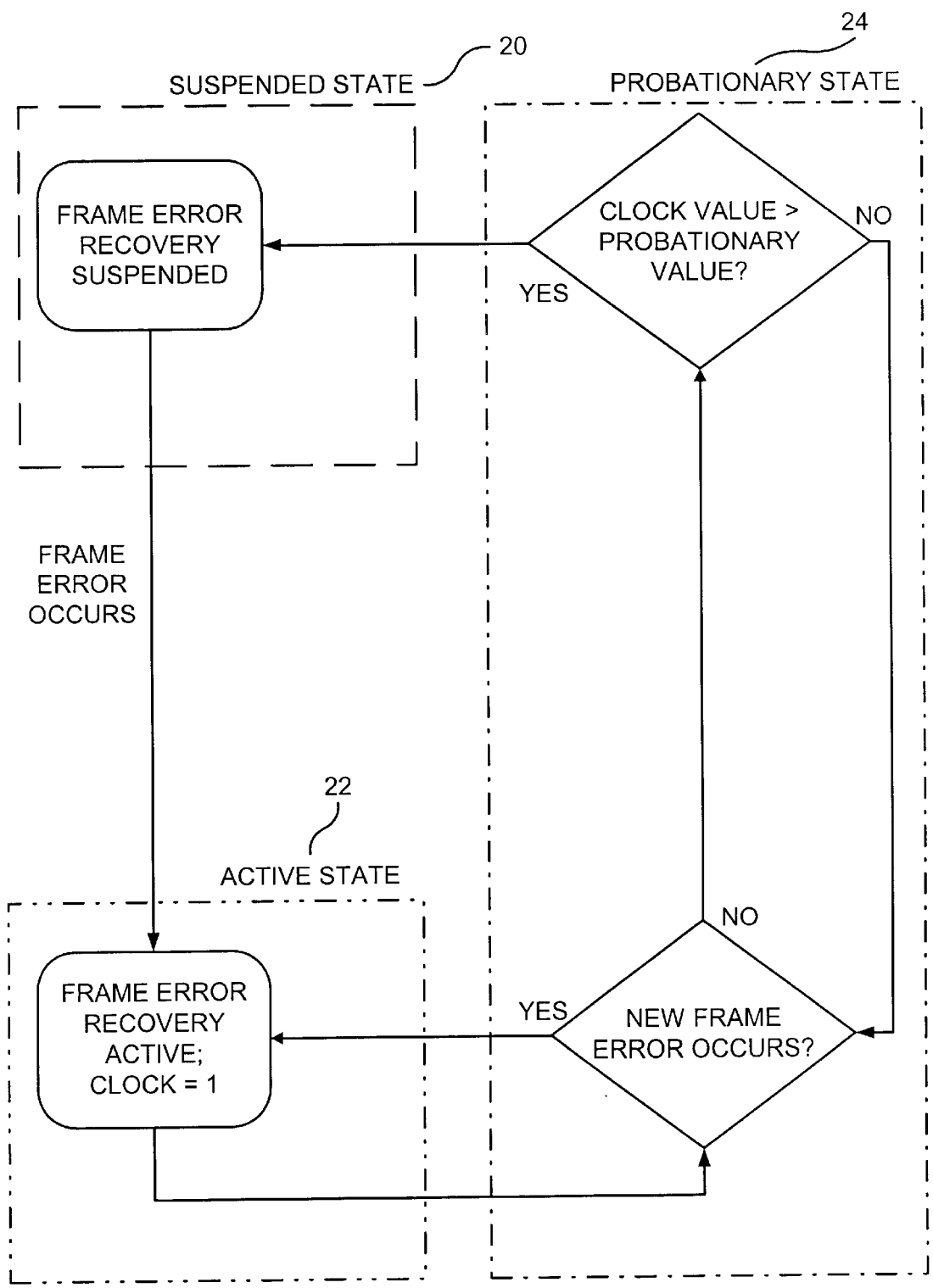
FIG. 4 is a flowchart of an embodiment of the method disclosed herein.
Figure 5:
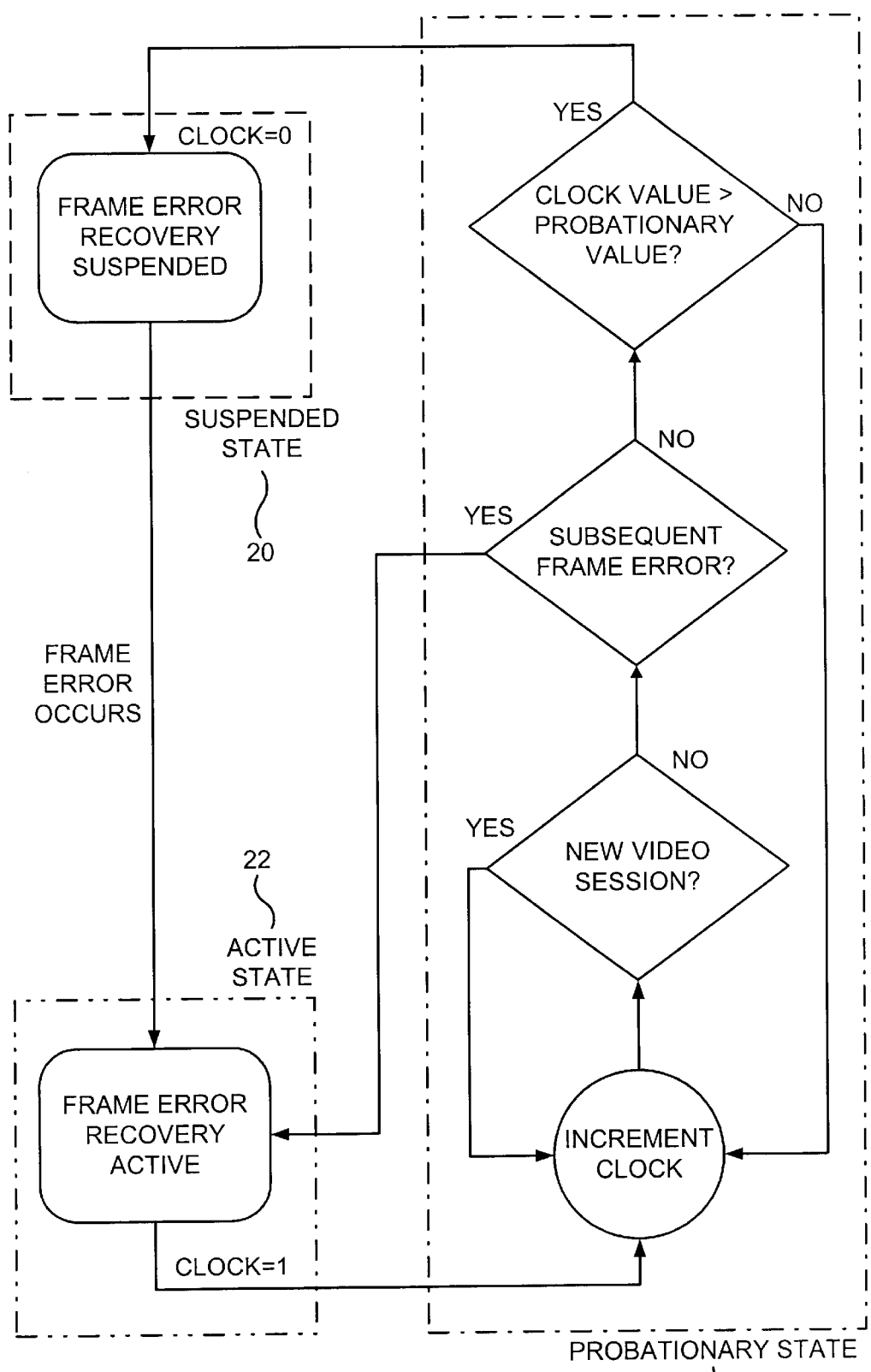
FIG. 5 is a flowchart of a second embodiment of the method disclosed herein.

In the embodiment of the automaton shown in FIGS. 4–5, timing of the probationary period is performed by a millisecond frame error clock. The clock has an initial value of 0. When active mode is initiated, the clock value is set to 1 and is incremented therefrom. A probation clock value is provided, wherein incrementing the millisecond clock from 1 to the probation clock value corresponds to the probationary period.

In this embodiment, receiving a second frame error signal causes the automaton to reset the clock value to 1 and restart the incrementing of the frame error clock. Should the first video session be terminated and a second video session begun during the probationary period, the clock value is maintained by being stored in memory (e.g., of the computer 12, automaton 16, or other apparatus component). Thus, the probationary period is not shortened by initiation of a second video session.

The above-described method can be in the form of instructions, stored on a storage medium, executable by a computer 12 or computing device.

A person skilled in the art will be able to practice the present invention in view of the description present in this document, which is to be taken as a whole. The specific embodiments herein disclosed and illustrated are not to be considered in a limiting sense. Indeed, it should be readily apparent to those skilled in the art in view of the present description that the invention can be modified in numerous ways. The inventor regards the subject matter of the invention to include all combinations and subcombinations of the various elements, features, functions and/or properties disclosed herein.

What is claimed is:

1. A method for controlling video frame error recovery in a streaming video session, comprising:

receiving a first frame error signal in a first video session;

activating a frame error recovery module;

timing a predetermined frame error probation period; and timing a second predetermined frame error probation period, if a second frame error detection signal is received during the predetermined frame error probation period, else deactivating the frame error recovery module.

2. The method of claim 1, wherein timing a predetermined frame error probation period comprises starting a millisecond frame error clock having an initial clock value of 1 and incrementing said clock.

3. The method of claim 2, further comprising:

saving the millisecond frame error clock value, if the first video session is terminated during the frame error probation period; and restoring the millisecond frame error clock value when a second video session is initiated.

4. The method of claim 2, further comprising resetting the millisecond frame error clock value to 1, if a second frame error signal is received during a predetermined frame error probation period.

5. The method of claim 1, wherein timing a predetermined frame error probation period is not interrupted if a second video session is initiated during the predetermined frame error probation period.

6. An article comprising a storage medium, said storage medium having stored thereon instructions that, when executed by a computing device, result in:

receiving a first frame error signal in a first video session;

activating a frame error recovery module;

timing a predetermined frame error probation period; and deactivating the frame error recovery module, if a second frame error detection signal is not received during the predetermined frame error probation period.

7. The article of claim 6, wherein timing a predetermined frame error probation period comprises starting a millisecond frame error clock having an initial clock value of 1 and incrementing said clock.

8. The article of claim 7, further comprising:

saving the millisecond frame error clock value, if the first video session is terminated during the frame error probation period; and restoring the millisecond frame error clock value when a second video session is initiated.

9. The article of claim 7, further comprising resetting the millisecond frame error clock value to 1, if a second frame error signal is received during a predetermined frame error probation period.

10. The article of claim 6, wherein timing a predetermined frame error probation period is not interrupted if a second video session is initiated during the predetermined frame error probation period.

11. A method for controlling video frame error recovery states in a streaming video apparatus, comprising:

operating a first video session in a suspended frame error recovery state;

receiving a first frame error signal;

switching to an active frame error recovery state and resetting a frame error clock;

switching to a probationary frame error recovery state for a predetermined frame error probation period; and switching to the frame error recovery suspended state, if the second frame error detection signal is not received during the predetermined frame error probation period.

12. The method of claim 11, wherein switching to an active frame error recovery state comprises activating a frame error recovery module.

13. The method of claim 12, wherein switching to a probationary frame error recovery state comprises maintaining the activated frame error recovery module.

14. An article comprising a storage medium, said storage medium having stored thereon instructions that, when executed by a computing device, result in:

operating a first video session in a suspended frame error recovery state;

receiving a first frame error signal;

switching to an active frame error recovery state and resetting a frame error clock;

switching to a probationary frame error recovery state for a predetermined frame error probation period; and switching to the frame error recovery suspended state, if the second frame error detection signal is not received during the predetermined frame error probation period.

15. The article of claim 14, wherein switching to an active frame error recovery state comprises activating a frame error recovery module.

16. The article of claim 15, wherein switching to a probationary frame error recovery state comprises maintaining the activated frame error recovery module.

17. A video apparatus, comprising:

a video device adapted to capture video frame data and output same;

a computer coupled to said video device, said computer having a processor capable of executing instructions stored on storage medium;

a frame error recovery module having multiple states; and a frame error recovery automaton operative to control the frame error recovery module in response to the presence of a video frame error.

18. The video apparatus of claim 17, wherein said states comprise suspended state, active state, and probationary state.

* * * * *